United States Patent [19]
Miller et al.

[11] 3,987,728
[45] Oct. 26, 1976

[54] RELIEF PRINTING PROCESS

[75] Inventors: Howard A. Miller; Kenneth L. Smith, both of Rochester; Peter M. Stacy, Webster, all of N.Y.

[73] Assignee: Eastman Kodak Company, Rochester, N.Y.

[22] Filed: Sept. 18, 1974

[21] Appl. No.: 507,030

[52] U.S. Cl. .............................. 101/426; 96/1 M; 96/1.4; 101/401.1; 101/467
[51] Int. Cl.² ......................................... B41C 1/06
[58] Field of Search .......... 101/467, 336, 243, 244, 101/426, 401.1

[56] References Cited
UNITED STATES PATENTS

| | | | |
|---|---|---|---|
| 627,229 | 6/1899 | Foster | 197/172 |
| 1,021,953 | 4/1912 | Steele | 197/172 |
| 2,311,047 | 2/1943 | Hagelin | 101/460 |
| 2,953,987 | 9/1960 | Johnson et al. | 101/336 |
| 2,955,052 | 10/1960 | Carlson et al. | 101/32 |
| 3,010,391 | 11/1961 | Buskes et al. | 101/467 |
| 3,220,837 | 11/1965 | Land et al. | 101/467 |
| 3,223,032 | 12/1965 | Boardman et al. | 101/463 |
| 3,223,838 | 12/1965 | Hoshino et al. | 101/471 |
| 3,364,858 | 1/1968 | Kojima et al. | 101/467 |
| 3,545,997 | 12/1970 | Hochberg | 117/21 |
| 3,592,644 | 7/1971 | Vrancken et al. | 96/27 |
| 3,645,204 | 2/1972 | Gosnell | 101/395 |
| 3,788,845 | 1/1974 | Osawa et al. | 101/470 |

FOREIGN PATENTS OR APPLICATIONS

| 1,553 | 1853 | United Kingdom | 101/426 |
|---|---|---|---|

*Primary Examiner*—Clyde I. Coughenour
*Attorney, Agent, or Firm*—John D. Husser

[57] ABSTRACT

A relief printing process utilizes a low relief printing form which is inked with a pressure transferable, non-liquid marking material prior to each printing impact. The printing form comprises a support layer on which there is deposited, in an imagewise pattern, a monolayer of uniformly sized granular developing particles within the range of about 25 to about 150 microns in diameter. The printing form can be prepared by a variety of colloid-transfer or electrostatic techniques.

6 Claims, 3 Drawing Figures

RELIEF PRINTING PROCESS

BACKGROUND OF THE INVENTION

This invention relates to an image reproduction process and, more particularly, to a relief printing process using low-relief printing forms in conjunction with a transferable, non-liquid marking material.

The spirit duplication process is frequently used when it is desired to produce a low or intermediate volume of copies at low cost. This process requires preparation of a master which carries a laterally reversed, soluble-dye image of the information to be reproduced. One common method of preparing such a master copy is to place the marking side of a sheet of soluble-dye-bearing paper such as carbon paper in contact with a first side of the master sheet so that when information is written or typed on the other side of the sheet, the dye is transferred to the first side of the master sheet. Another method of preparing such a master copy is to expose a light sensitive hydrophilic organic colloid layer capable of being differentially tanned or hardened under influence of light, such as an unhardened gelatino-silver halide emulsion layer to an imagewise pattern of light. Subsequent to the imagewise photoexposure, the colloid matrix sheet is contacted while moist with a clean absorbent sheet of paper to transfer a thin stratum of the unexposed tacky areas of the light sensitive element to the paper which forms a relief image after the sheets have been separated. Shortly thereafter, while the relief image is still moist, the paper is squeegeed against a spirit duplicating master sheet of a type well known in the art carrying a soluble dye so that the dye adheres to the relief image when the sheets are separated.

The dyes, such as carbon ink, used in the spirit reproduction process are soluble in various organic solvents such as alcohol, acetone and the like. When it is desired to make reproductions, a receiver sheet of plain paper is slightly moistened with such a solvent and pressed into contact with the master sheet whereby a small amount of the dye is transferred to the receiver sheet. While advantageous from a cost standpoint, spirit reproduction processes have the disadvantages of requiring solvent treatment and producing prints exhibiting relatively low image definition and a high amount of background smudging.

Another low volume copying process disclosed in Canadian Pat. No. 817,079 forms an electrostatic image on a support material and then develops such image with a hard, comparatively coarse, granular material (average grain diameter between 50 and 250 microns) to form a relief image. The developed relief image, held in place by electrostatic attraction, is overlaid with one or more sets of carbon paper and associated receiver paper and printed using a mechanical pressure printing apparatus. One to five dry copies can be reproduced by this process, however, the image sharpness of the copies is relatively low as a result of the lateral movement of the toner particles during the printing operation and the pressure of the intervening carbon sheets. Another disadvantage of this process is that the relief image cannot be reused because it is not permanently fixed to the support.

SUMMARY OF THE INVENTION

It is, therefore, an object of the present invention to eliminate the aforementioned disadvantages of the prior art and provide an improved, dry, low volume relief printing process which is economical and produces good quality copy. In general, the present invention involves forming a master, having a monolayer of substantially uniformly sized granular developing particles arranged in a desired imagewise pattern on one surface thereof, and inking the master with a dry pressure transferable marking material prior to each paper printing impact.

The process of the present invention has many advantages over prior art low cost duplicating processes. For example, prints produced by the inventive process are characterized, even during extended press runs, by good image definition, clean background and excellent uniformity of image density over the entire copy area. The process is carried out without solvent treatment and without the presence during the printing impression of an intervening carbon sheet. The process utilizes a master, which can be formed by a variety of colloid-transfer or electrostatic techniques, that is durable and can be easily stored for future use.

The invention and its objects and advantages will become more apparent by referring to the accompanying drawings and to the ensuing detailed description of the preferred embodiment which follows.

DETAILED DESCRIPTION OF THE PREFERRED EMBODIMENTS

Figure 1:
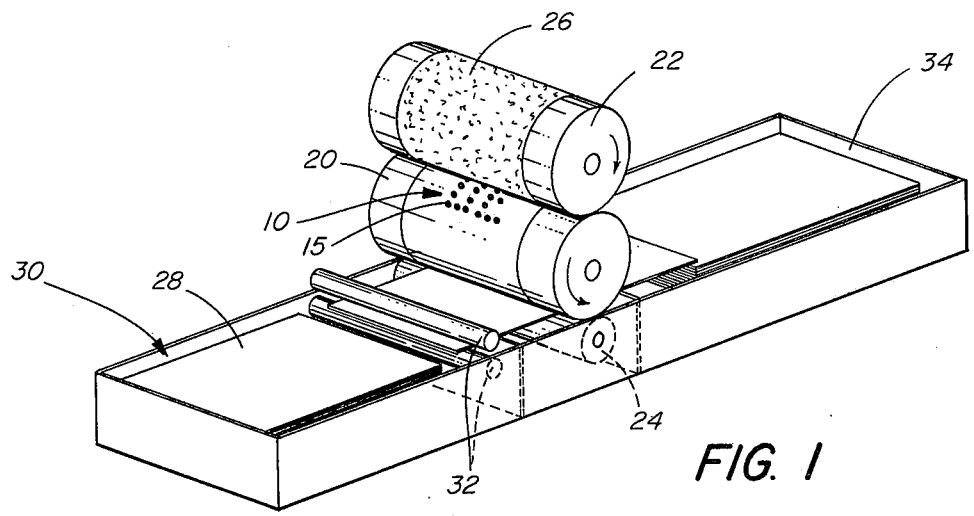
FIG. 1 shows one illustrative embodiment of a relief printing apparatus useful in carrying out the inventive process.

Referring now to the drawings and particularly to FIG. 1, there is shown an illustrative embodiment of a relief printing apparatus adapted to carry out the process of the present invention. The printing apparatus includes three cylindrical steel rollers: a printing roller 20, an inking roller 22 and a pressure roller 24, respectively, which are interconnected by means of gears, sprockets and chains, pulleys and belts or the like (not shown) to run at identical peripheral speeds. A low-relief printing form or master 10, made in a manner subsequently described in greater detail, is mounted on the printing roller 20 and a sheet of carbon paper 26, for example an 8½ by 11 inch sheet of light weight Keelox carbon paper sold under the trademark "Kopy-Aligner", is mounted on the inking roller 22. Operating either manually or by a motor drive, the printing roller 20 revolves counterclockwise as shown by arrow A carrying the printing form 10 under the inking roller 22 where a stratum of the pressure transferrable, marking material layer of the carbon paper 26 is transferred to the relief portions 15 of the printing form 10. As the printing roller 20 continues to revolve a plain paper receiver sheet 28 is fed from a supply bin 30 through a pair of separator rollers 32 and is carried in register with the ink printing form 10 through the nip formed between the printing roller 20 and the pressure roller 24 where at least a portion of the marking material is transferred to the receiver sheet 28. The receiver sheet 28 bearing the ink impression is then deposited in a collection bin 34.

If desired, the printing apparatus shown in FIG. 1 can be modified by replacing the inking roller 22 with a multiple roller inking assembly (not shown). A multiple roller inking arrangement increases ink deposition since inking action is obtained simultaneously with two or more rollers. This arrangement also permits rapid selection among two or three colors of ink and facilitates changing a depleted carbon sheet while the printing apparatus is in operation.

Figure 2:
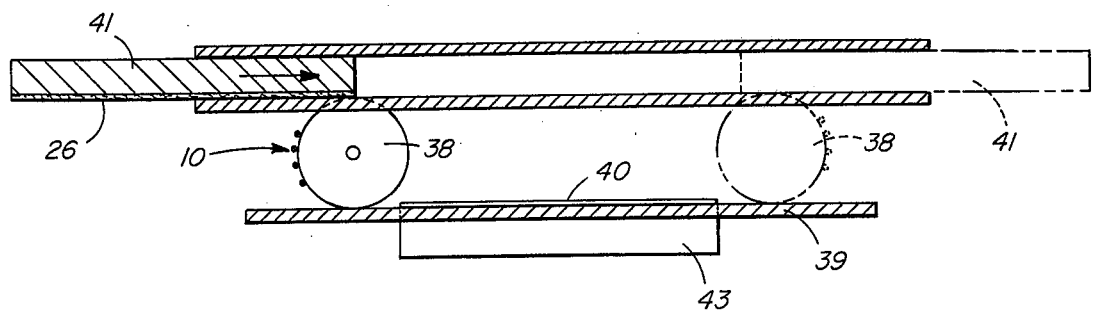
FIG. 2 shows another illustrative embodiment of a relief printing apparatus useful in carrying out the inventive process.

The printing apparatus shown in FIG. 2 is a flat bed type in which the printing form 10 is carried on a press cylinder 38 and simultaneously moved against an underlying horizontal printing platen 39 carrying a plain paper receiving material 40 on its upper surface and an overlying horizontal inking platen 41 carrying on its lower surface a carbon sheet 26 or equivalent solid, dry, marking-material web. The receiving material is fed in sheets or in a continuous length from a supply 43 by a suitable manual or mechanical means (not shown). The two horizontal platens 39 and 41 and the press cylinder 38 are linked together by a rack and pinion gear or similar means (not shown). Inking and printing take place simultaneously in different areas of the printing form 10. One print is made on each transit of the press cylinder 38 across the printing platen 39, so that two prints are made in each complete cycle. To increase the number of high quality copies produced means, for example, a ratchet and pawl device, are also provided to change the position of the marking material sheet or web at intervals, for example, by advancing it 1/32 to 1/16 inch along the platen 41 between successive cycles of the printing operation. For example, by so indexing an 8½ by 11 inch sheet of carbon paper used as the inking medium, up to 500 copies can be produced.

If desired, the printing apparatus can be modified by giving the flat platens 39 and 41 a little arch, i.e. making them longitudinal sections of cylinders, to facilitate applying and clamping the receiver material 40 and particularly the carbon sheet 26 firmly and smoothly in place.

Figure 3:
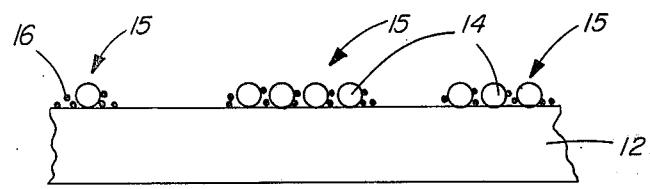
FIG. 3 schematically illustrates a low relief relief printing form advantageously printed by the inventive process.

Referring now to FIG. 3, the printing form or master 10, used in the above-described pressure printing apparatus comprises a support layer 12 of uniform thickness and resilience on which there is deposited in an imagewise pattern, a monolayer of granular particles 14 which form relief areas 15.

The printing form 10 can be prepared by several different methods. In the preferred method, the form 10 is prepared by a colloid transfer process. This process comprises the steps of exposing a matrix sheet including a layer of a film-forming colloid material to an imagewise pattern of activating energy, subjecting the exposed material to a development process which hardens the exposed areas and generates a soft tacky condition in the unexposed areas, bringing the developed matrix sheet into intimate contact with the receiving support layer 12 and then stripping the matrix sheet away leaving a transferred, tacky, positive relief image 15 of the original image on the receiving support layer 12.

A wide variety of colloid-transfer matrix materials can be used in the colloid transfer process of the present invention including silver halide sensitive photographic materials, thermographic materials and photothermographic materials.

The receiving support layer 12 is selected to provide good adhesion for the transferred image. A typical receiving support layer 12 useful in the colloid-transfer process is thin, flexible, uniform in thickness and relatively incompressible. Useful support layers 12 include, for example, paper, parchment, glassine, plastic films such as cellophane, cellulose ester, polyester, polyolefin or the like, and metal films such as aluminum foil. The support thickness is within the range of about ¼ to about 5 mils and preferably within the range of about ½ to about 2.5 mils in thickness. Optionally, to improve the adhesion of the transferred image, the support layer can be mechanically or chemically etched or overcoated with a thin layer containing gelatin. If the printing form 10 is inked and printed directly, a laterally reversed (wrong-reading) relief image 15 is formed on a support layer 12 and, in this circumstance, support layer thickness has relatively little effect on image resolution. However, if the ink is to be applied to the support side of the printing form 10, a right-reading relief image 15 is formed on the support layer, and in this circumstance, it is important that the support layer thickness be kept as low as possible to limit the loss and image sharpness occasioned by the fact that the support layer 12 now overlays the relief image 15.

Development of the transferred, tacky relief image 15 can be accomplished by sprinkling or cascading granular toner particles 14 over the image bearing surface or by moving the entire support surface through a bin or trough containing the developer particles. The layer of transferred colloid is very thin and will accommodate only a mono layer of the developer particles. The developing particles are desirably mono-sized and within the limits of about 25 to about 150 microns in diameter, with the preferred size range between about 40 and about 80 microns. A wide variety of granular developing particles are sufficiently rigid and non-friable to meet the demands of the developing and printing operations including sieved beach sand, crushed stone, ground bone, hardwood chips, inorganic salts and oxides. However, the best developing characteristics are obtained with spherical particles having sufficient electrical conductivity to permit the particles to flow freely. Granular powders especially suited as developing particles include glass beads, preferably metal coated, bronze, iron, steel or stainless steel spheres; and particles having at least an exterior layer of thermoplastic resin which may be arranged around a rigid core of glass, metal, or thermo set resin.

After development of the tacky relief image 15, excess toner is removed by tapping or shaking the printing form 10, by use of a low-pressure air squeegee, by gentle brushing with a camel's hair brush, or the like. The resulting printing form 10 is approximately 30 to 300 microns (1–12 mils) thick.

To improve the durability and abrasion-resistance of the printing form 10, the relief areas 15 can be sprayed with a lacquer or other solution of a film-forming resin. If the granular developing particles or support surface used comprises a thermoplastic or solvent-soluble resin, heat or solvent (advantageously, solvent vapor) can be applied to permanently adhere the particles to the support surface. Alternatively, the support surface bearing the relief areas can be overlaid with a thin, pressure-sensitive or heat-sensitive film.

A particularly effective fixing procedure comprises sprinkling, spraying or cascading the monolayer relief image with a very fine thermoplastic, film-forming resin powder 16 which melts below the softening temperature of the granular developing particles 14 and the distortion temperature of the support layer 12. The printing form 10 is then uniformly heated to raise the temperature of the resin powder 16 above its melting point so as to coalesce and bind the granular particles 14 to the support layer 12. The heating can be accomplished by a variety of techniques well known in the art, for example by applying infrared radiation to the form 10 or by bringing the support layer 12 into contact with a uniformly heated surface. If the background areas of the support layer 12 and the resin powder 16 are relatively infrared transparent and/or reflective, infrared radiation can be advantageously combined with infrared-absorptive granular developing particles 14 to provide maximum heat and thus fixing in the image areas containing such developing particles without melting the resin powder particles 16 which remain in the background areas. Alternatively, the resin powder particles 16 can be made infrared absorptive. This reduces the amount of radiant energy required for fixing; however, it does increase the background contamination. The particle size of the resin powder 16 should be fine enough to ensure its entry into the voids between the granular particles 14. A useful lower limit is about 5 microns in diameter although there is no absolute restriction on the minimum size except to avoid excessive dusting, clumping, and the like which increase as the resin powder 16 becomes finer and the bulk resistivity rises. On the other hand, resin particles larger than 10–20 microns in diameter can be used if the melt viscosity at the fixing temperature is sufficiently low, i.e. between 5 and 20 poises, to ensure that the resin flows readily into the interstices of the granular relief image. Useful resin powders include certain polyamides such as the Emerez 1530 series polyamides, low melting polyesters such as the highly crystalline decamethylene sebacate polymers, shellac, rosin, low melting polystyrene and polystyrene copolymers, acrylic resins and the like.

The printing form or master 10 can also be prepared using electrostatic techniques. For example, a printing form 10 can be prepared from a xerographic element comprising a 0.004 inch thick polyester support, a thin electrically conducting layer and a 15 micron thick photoconductive layer containing a dye-sensitized organic photoconductor in a resin binder. The xerographic element is provided with a uniform charge of either polarity by corona treatment, exposed to a projected light image of an original document to discharge the exposed areas and developed with electrically conducting iron spheres of approximately 75 micron particle size. The developed element is then passed under a permanent strip magnet at a spacing of 1.27 centimeters (½ inch). The magnet removes any developer spheres which adhere to the exposed background areas of the element without affecting the developed image. The resulting relief image is then stabilized by any one of the three image fixing procedures previously described in connection with the preparation of a printing form 10 using a colloid transfer technique. In this illustrative example the xerographic element serves as the support layer 12. However, in certain applications, it is desirable to employ a reusable photoconductive element in which case the image pattern formed thereon is transferred to a secondary receiver prior to the image stabilization step.

The following examples will serve to further illustrate the present invention.

EXAMPLE 1

A sheet of Verifax CS fine line matrix paper (a silver-halide sensitized, colloid-transfer material manufactured by Eastman-Kodak Company) is exposed by reflex for 12 seconds to a business letter typed on bond paper in the Verifax Regent Copier, model FG manufactured by the Eastman Kodak Company and then developed for 15 seconds at 29° C in the Verifax developer. As the matrix is removed from the developer, it is squeegeed into contact with a sheet of Verifax S13 copy paper used as the image receiver. The matrix sheet is stripped away leaving a transferred tacky positive image of the original on the receiver. Spherical iron toner particles approximately 80 ± 5 microns diameter are cascaded over this image and the excess toner is removed by gentle tapping. The image is allowed to dry and then sprayed with clear Krylon spray lacquer to provide a film overcoat and improve the durability of the image. The resulting right reading image printing form 10 is mounted on the printing roller 20 of the printing apparatus depicted in FIG. 2, the form being mounted relief-image side down on the printing roller 20. The printing form 10 is inked on its support side with blue carbon tissue paper and is used to print 100 right-reading copies on bond paper. The printing form 10 is then removed from the printing apparatus, remounted relief-image-side up on the printing roller 20, inked with the same sheet of carbon paper and used to print 100 wrong reading copies on bond paper. The relief printing form 10 holds up well to the handling and stresses of the printing operation and produces legible copies of good density in each printing mode. However, the wrong reading copies obtained by printing directly from the relief image 15 are somewhat sharper than those made by inking the support layer 12 of the form 10. The printing procedure is repeated using onion skin paper as the receiver and mounting the printing form 10 relief image side down on the printing roller 20 so that ink is applied to the support layer 12 of the form. The right-reading copies obtained are appreciably sharper than those printed through the Verifax copy paper because of the thinner, less resilient support.

EXAMPLE 2

An infrared-transparent, colloid-transfer thermographic material comprising a paper support bearing a layer of thermoplastic resin, which is annealed to provide an abnormally high tackifying temperature, is used to form an image. When specific areas of this material are heated to the softening point, disorientation of the resin molecules occurs and on cooling and reheating the resin in these areas exhibits a considerably lower tackifying temperature. An 8½ by 11 inch sheet of this matrix material is placed in intimate contact with a sheet of typed matter and an extremely intense, uniform, short duration burst of infrared radiation is directed at the original document through the thermographic layer. In the portions of that layer in contact with the black, infrared absorptive characters of the original document, heat generated by the absorption of the radiation passes by conduction into the resin, softening it in these areas and lowering its tackifying temperature. After cooling the thermographic matrix material bearing this latent image pattern is then heated in contact with a sheet of receiving paper to a temperature above the tackifying point of the latent image areas but below that of the annealed background. The receiving sheet is removed bearing a transferred image of resin. The sheet is then heated above the softening point of the resin and sprinkled with 60 micron black glass beads. To improve the abrasion resistance of the printing form the relief areas are overlaid with a 0.003 inch thick pressure-sensitive, adhesive film. The printing form 10 is mounted relief side up on the roller 38 of the printing apparatus depicted in FIG. 3, inked with a sheet of carbon paper mounted on the under surface of the inking platen 41 and used to print 500 copies on thin white bond paper.

EXAMPLE 3

An 8½ by 11 inch sheet of a colloid-transfer photothermographic material comprising an 8 mil polyethylene terephthalate film support bearing a thin coating of a photosensitive resin is reflex-exposed to a magazine advertisement containing halftone and line material in addition to typed matter. The photosensitive resin becomes crosslinked by the exposure to light with a concomitant increase in the tackifying temperature in the exposed areas so that by heating the material to a temperature between 55° and 85° C the unexposed regions become soft and tacky while the exposed regions remain hard. The soft, tacky portions of the colloid transfer sheet are transferred to a thin, translucent, greaseproof paper manufactured by the SD Warren Company by bringing the two sheets into intimate contact and then separating them. The transferred images can be handled freely and stacked even under pressure without sticking at normal room temperature. When it is desired to develop a transferred image to make a relief plate, the resin image is heated to 65° C and bronze spheres (50 to 70 microns in diameter) are cascaded over the sheet.

The sheet is cooled to room temperature and the spheres are found to be sufficiently well retained to permit normal handling and extended printing in the mode in which the relief faces the plate-supporting surface of the press. For printing relief side up the relief image is further strengthen by applying a bonding medium, at least in the developed areas of the printing form, comprising a finely divided, low temperature melting, thermoplastic resin powder and applying heat to the printing form to melt the resin powder to form a continuous film which firmly adheres the relief image to the support layer 12 of the printing form. The printing form 10 is then mounted relief image side up on the roller 38 of the printing apparatus depicted in FIG. 3, inked with a sheet of carbon paper mounted on the under surface of the inking platen 41 and used to print 500 copies on thin, white bond paper.

The invention has been described in detail with particular reference to preferred embodiments thereof, but it will be understood that variations and modifications can be effected within the spirit and scope of the invention.

We claim:

1. A typographic printing process comprising the steps of:
    a. exposing a matrix sheet including a layer of a film forming colloid material to an imagewise pattern of activating energy;
    b. subjecting the exposed matrix sheet to a development process which produces a differential pattern of surface adhesivity in the exposed and unexposed areas of said colloid material;
    c. transferring the adhesive areas of the matrix sheet to a flexible support having a thickness of from approximately 10 microns to approximately 125 microns;
    d. applying a mono-layer of substantially uniformly sized, non-friable granular particles having a diameter of from about 40 microns to about 80 microns to the adhesive areas of said support to form a low relief printing form of from approximately 50 microns to approximately 200 microns in thickness; and
    e. alternatively bringing said printing form into pressure contact with (1) an inking member having on at least one surface thereof a uniform layer of a non-liquid pressure transferable marking material to transform a stratum of said marking material to the printing surfaces of said printing form and (2) a paper receiver sheet to transfer at least a portion of said stratum of marking material from said printing surfaces to said receiver sheet.

2. The process of claim 1 further including the steps of:
    a. applying to said granular particles, thermoplastic powder particles having a diameter of from about 5 microns to about 20 microns which melt below the softening temperature of said granular particles and the distortion temperature of said receiving surface; and
    b. uniformly heating the printing form to melt said thermoplastic powder so as to form a continuous film which binds said granular particles to said support.

3. The process of claim 1 wherein said colloid material is selected from the group consisting of silver halide sensitive photographic materials, thermographic materials and photothermographic materials.

4. The process of claim 1 further including the step of laminating a thin film to the surface of said printing form bearing said granular particles.

5. The process of claim 1 further including the step of spraying the surface of said printing form bearing said granular particles with a film-forming resinous material.

6. A typographic printing process comprising the steps of:
    a. placing an original document containing typed information into intimate contact with an infrared transparent element comprising a paper support coated with a layer of a thermoplastic resin;
    b. directing an intense, uniform, short duration burst of infrared radiation at said original document through said thermoplastic layer;
    c. cooling said element;
    d. placing said element in contact with a receiving surface and reheating said element above the tackifying point of the exposed areas but below the tackifying point of the unexposed areas;
    e. removing the receiving surface bearing a transferred resin image from said element;
    f. applying a mono-layer of spherical, free-flowing, substantially uniformly sized, non-friable granular particles having a diameter of about 40 microns to about 80 microns into contact with said transferred resin image to form a low relief printing form of from approximately 50 microns to approximately 200 microns in thickness; and g. alternatively bringing said printing form into pressure contact with (1) an inking member having on at least one surface thereof a uniform layer of a non-liquid pressure transferable marking material to transfer a stratum of said marking material to the printing surfaces of said printing form; and (2) a paper receiver sheet to transfer at least a portion of said stratum of marking material from said printing surfaces to said receiver sheet.

* * * * *